(12) United States Patent
Shi et al.

(10) Patent No.: US 10,920,106 B2
(45) Date of Patent: *Feb. 16, 2021

(54) METAL CHEMICAL MECHANICAL PLANARIZATION (CMP) COMPOSITION AND METHODS THEREFORE

(71) Applicant: Versum Materials US, LLC, Tempe, AZ (US)

(72) Inventors: Xiaobo Shi, Chandler, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/564,939

(22) Filed: Sep. 9, 2019

(65) Prior Publication Data

US 2020/0032107 A1 Jan. 30, 2020

Related U.S. Application Data

(62) Division of application No. 16/110,422, filed on Aug. 23, 2018, now Pat. No. 10,465,096.

(60) Provisional application No. 62/549,608, filed on Aug. 24, 2017.

(51) Int. Cl.
*C09G 1/02* (2006.01)
*H01L 21/321* (2006.01)
*H01L 21/768* (2006.01)

(52) U.S. Cl.
CPC ............ *C09G 1/02* (2013.01); *H01L 21/3212* (2013.01); *H01L 21/76898* (2013.01)

(58) Field of Classification Search
None
See application file for complete search history.

(56) References Cited

U.S. PATENT DOCUMENTS 10,465,096 B2 * 11/2019 Shi ...................... H01L 21/3212

* cited by examiner

*Primary Examiner* — Roberts P Culbert
(74) *Attorney, Agent, or Firm* — Lina Yang

(57) ABSTRACT

Provided are Chemical Mechanical Planarization (CMP) formulations that offer high and tunable Cu removal rates and low copper dishing for the broad or advanced node copper or Through Silica Via (TSV). The CMP compositions provide high selectivity of Cu film vs. other barrier layers, such as Ta, TaN, Ti, and TiN, and dielectric films, such as TEOS, low-k, and ultra low-k films. The CMP polishing formulations comprise water; abrasive; single chelator, dual chelators or tris chelators; morpholino family compounds as Cu dishing reducing agents. Additionally, organic quaternary ammonium salt, corrosion inhibitor, oxidizer, pH adjustor and biocide can be used in the formulations.

21 Claims, 6 Drawing Sheets

METAL CHEMICAL MECHANICAL PLANARIZATION (CMP) COMPOSITION AND METHODS THEREFORE

CROSS REFERENCE TO RELATED APPLICATIONS

This application is a divisional application of U.S. application Ser. No. 16/110,422 filed on Aug. 23, 2018 which claims priority to U.S. provisional application 62/549,608 filed on Aug. 24, 2017, the entire contents of which is incorporated herein by reference thereto for all allowable purposes.

BACKGROUND OF THE INVENTION

This invention relates generally to the chemical-mechanical planarization or chemical-mechanical polishing (CMP) of semiconductor wafers. More specifically, present invention relates to high and tunable metal films, such as Cu, Co, W, Ni, Al, etc., removal rates and low dishing formulations for the broad or advanced node copper or other metal film polishing CMP applications. CMP polishing formulations, CMP polishing compositions or CMP polishing slurries are interchangeable in present invention.

Copper is the current material of choice for interconnect metal used in the fabrication of integrated electronic devices due to its low resistivity, high reliability, and scalability. Copper chemical mechanical planarization processes are necessary to remove copper overburden from inlaid trench structures while achieving global planarization with low metal loss.

With advancing technology nodes the need to reduce metal dishing and metal loss becomes increasingly important. Any new polishing formulations must also maintain high removal rates, high selectivity to the barrier material and low defectivity.

Copper CMP have been done in the prior arts, for example, in. U.S. Pat. No. 9,3065,806; US20160314989; US20130092651; US 20130078811; U.S. Pat. Nos. 8,679, 980; 8,791,019; 8,435,421; 7,955,520; US 20130280910; US 20100221918; U.S. Pat. No. 8,236,695; TW 1385226; US 20120094490; U.S. Pat. No. 7,955,520; US20040175942, U.S. Pat. Nos. 6,773,476, and 8,236,695.

However, the prior arts reported and disclosed formulations were unable to meet the performance requirements of high removal rates and low dishing which become more and more challenging for advanced technology nodes.

This invention discloses bulk copper CMP polishing formulations developed to meet challenging requirements of low dishing and high removal rates for the advanced technology nodes. The disclosed copper CMP polishing formulations can also be used for other metal film CMP applications.

BRIEF SUMMARY OF THE INVENTION

Figure 1:
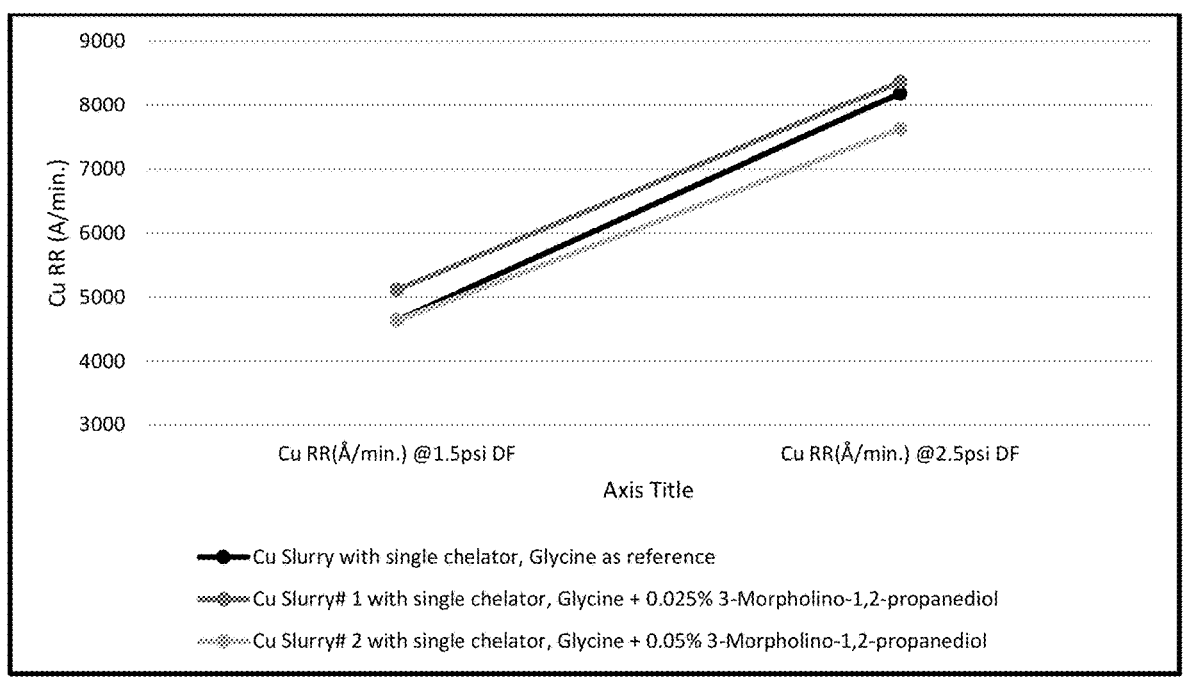
FIG. 1 shows Cu polishing results from formulations using single chelator (as the reference sample) vs single chelator with a chemical additive as Cu dishing reducer

Described herein are CMP polishing compositions, methods and systems for the copper or other metal films, such as Co, W, Ni, Al, etc., polishing CMP applications.

In one aspect, the invention herein provides a metal or metal film bulk chemical mechanical polishing (CMP) or Through Silica Via (TSV) composition comprises:
  a) abrasive;
  b) at least one chelator; such as single, dual or tris chelators;
  c) corrosion inhibitor;
  d) a chemical additive as Cu dishing reducer
  e) oxidizing agent;
  f) biocide; and
  g) water; optionally
  h) organic quaternary ammonium salt; and
  i) pH adjusting agent;
  wherein
  the chelators are selected from the group consisting of amino acids, amino acid derivatives, organic amine, and combinations therefor; wherein at least one chelator is an amino acid or an amino acid derivative for tris chelators;
  the metal is selected from the group consisting of Cu, Co, W, Ni, Al, and combinations thereof; and
  the pH of the composition is from 3.0 to 12.0; preferably from 5.5 to 8.0; and more preferably from 6.0 to 7.5.

In another aspect, the invention provides a method of chemical mechanical polishing at least one metal or metal-containing surface or metal films of a semiconductor substrate, using a chemical mechanical polishing composition comprising steps of:
  1. providing the semiconductor substrate;
  2. providing a polish pad;
  3. providing the chemical mechanical polishing or Through Silica Via (TSV) composition comprising
  a) abrasive;
  b) at least one chelator; such as single, dual or tris chelators;
  c) corrosion inhibitor;
  d) a chemical additive as Cu dishing reducer
  e) oxidizing agent;
  f) biocide; and
  g) water; optionally
  h) organic quaternary ammonium salt; and
  i) pH adjusting agent;
  wherein
    the chelator is selected from the group consisting of amino acids, amino acid derivatives, organic amine, and combinations therefor; wherein at least one chelator is an amino acid or an amino acid derivative for tris chelators;

the metal is selected from the group consisting of Cu, Co, W, Ni, Al, and combinations thereof; and
the pH of the composition is from 3.0 to 12.0; preferably from 5.5 to 8.0; and more preferably from 6.0 to 7.5;

4. contacting the at least one copper or copper-containing surface or other metal film surface with the polish pad and the chemical mechanical polishing composition; and 5. polishing the at least one copper or copper-containing surface or other metal film surface;

wherein at least a portion of the surface is in contact with both the polishing pad and the chemical mechanical polishing composition.

In yet another aspect, the invention provides a method of a selective chemical mechanical polishing comprising steps of:

a) providing a semiconductor substrate having at least one surface containing a first material and at least one second material;
b) providing a polishing pad;
c) providing a chemical mechanical polishing or Through Silica Via (TSV) composition comprising
   1) abrasive;
   2) at least one chelator; such as single, dual or tris chelators;
   3) corrosion inhibitor;
   4) a chemical additive as Cu dishing reducer
   5) oxidizing agent;
   6) biocide; and
   7) water; optionally
   8) organic quaternary ammonium salt; and
   9) pH adjusting agent;
   wherein
      the chelators are selected from the group consisting of amino acids, amino acid derivatives, organic amine, and combinations therefor; wherein at least one chelator is an amino acid or an amino acid derivative for tris chelators; and
      the pH of the composition is from 3.0 to 12.0; preferably from 5.5 to 8.0; and more preferably from 6.0 to 7.5;
d) contacting the at least one surface with the polish pad and the chemical mechanical polishing composition; and
e) polishing the at least one surface to selectively remove the first material;
wherein removal rate of the first material to removal rate of the second material is equal or greater than 500:1; preferably 1000:1; and more preferably 3000:1;
the first material is selected from the group consisting of Cu, Co, W, Ni, Al, and combinations thereof; and the second material is selected from the group consisting of barrier layer such as Ta, TaN, Ti, and TiN film, dielectric layer such as TEOS, low-k, and ultra low-k film.

In yet another aspect, the invention provides a system of chemical mechanical polishing at least one metal or metal-containing surface or other metal film surface of a semiconductor substrate, comprising
1. the semiconductor substrate;
2. a polish pad;
3. a chemical mechanical polishing or Through Silica Via (TSV) composition comprising
   a) abrasive;
   b) at least one chelator; such as single, dual or tris chelators;
   c) corrosion inhibitor;
   d) a chemical additive used as Cu dishing reducer
   e) biocide; and
   f) water based solvent selected from the group consisting of deionized (DI) water, distilled water, and water based alcoholic organic solvent;
   g) optionally
   h) organic quaternary ammonium salt; and
   i) pH adjusting agent;
   wherein
      the chelators are selected from the group consisting of amino acids, amino acid derivatives, organic amine, and combinations therefor; wherein at least one chelator is an amino acid or an amino acid derivative for tris chelators;
      the metal is selected from the group consisting of Cu, Co, W, Ni, Al, and combinations thereof; and
      the pH of the composition is from 3.0 to 12.0; preferably from 5.5 to 8.0; and more preferably from 6.0 to 7.5;
   wherein at least a portion of the at least one metal or metal-containing surface or other metal film surface is in contact with both the polishing pad and the chemical mechanical polishing or Through Silica Via (TSV) composition.

The abrasive particles used for the disclosed herein Cu bulk CMP polishing compositions include, but are not limited to, the following: colloidal silica or high purity colloidal silica; the colloidal silica particles doped by other metal oxide within lattice of the colloidal silica, such as alumina doped silica particles; colloidal aluminum oxide including alpha-, beta-, and gamma-types of aluminum oxides; colloidal and photoactive titanium dioxide, cerium oxide, colloidal cerium oxide, nano-sized inorganic metal oxide particles, such as alumina, titania, zirconia, ceria etc; nano-sized diamond particles, nano-sized silicon nitride particles; mono-modal, bi-modal, multi-modal colloidal abrasive particles; organic polymer-based soft abrasives, surface-coated or modified abrasives, or other composite particles, and mixtures thereof.

The organic quaternary ammonium salt, includes but is not limited to choline salt, such as choline bicarbonate salt, or all other salts formed between choline and other anionic counter ions.

The corrosion inhibitors include but are not limited to family of hetero aromatic compounds containing nitrogen atom(s) in their aromatic rings, such as 1,2,4-triazole and derivatives, benzotriazole and benzotriazole derivatives, tetrazole and tetrazole derivatives, imidazole and imidazole derivatives, benzimidazole and benzimidazole derivatives, pyrazole and pyrazole derivatives, and tetrazole and tetrazole derivatives.

The chemical additive used as Cu dishing reducers includes, but is not limited to the family of morpholino compounds or oligomers, having the general molecular structure as shown below:

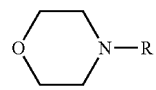

wherein, R represents hydrogen or any one of various organic functional groups which attached to the nitrogen atom in morpholino 6-member ring through covalent boding with no net charges.

R includes, but is not limited to, alkyl primary amines with a single primary amine group or two or more than 2 primary amine groups in the same molecule, alkyl primary amines with a single secondary amine group or two or more than 2 secondary amine groups in the same molecule, alkyl amide with a single amide group or two or more than 2 amide groups in the same molecule, alkene primary amines with a single primary amine group or two or more than 2 primary amine groups in the same molecule, alkene primary amines with a single secondary amine group or two or more than 2 secondary amine groups in the same molecule, alkene amide with a single amide group or two or more than 2 amide groups in the same molecule, alkyne primary amines with a single primary amine group or two or more than 2 primary amine groups in the same molecule, alkyne primary amines with a single secondary amine group or two or more than 2 secondary amine groups in the same molecule, and alkyne amide with a single amide group or two or more than 2 amide groups in the same molecule.

R also includes, but is not limited to, alkyl alcohol with a single hydroxyl group or two or more than 2 hydroxyl groups in the same molecule, alkene alcohol with a single hydroxyl group or two or more than 2 hydroxyl groups in the same molecule, and alkyne alcohol with a single hydroxyl group or two or more than 2 hydroxyl groups in the same molecule.

The chemical additive used as Cu dishing reducers includes, but is not limited to the family of morpholino compounds or oligomers having the general molecular structure as shown below:

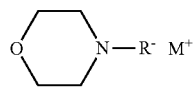

wherein, $R^-$ represents various organic functional groups which attached to the nitrogen atom in morpholino 6-member ring through covalent boding with negative charges.

The $R^-$ organic functional groups include, but are not limited to, alkyl sulfonate with one sulfonate group or two or more than 2 sulfonate groups in the same molecule, alkyl carbonate with one carbonate group or two or more than 2 carbonate groups in the same molecule, alkyl phosphate with one phosphate group or two or more than 2 phosphate groups in the same molecule, alkene sulfonate with one sulfonate group or two or more than 2 sulfonate groups in the same molecule, alkene carbonate with one carbonate group or two or more than 2 carbonate groups in the same molecule, alkene phosphate with one phosphate group or two or more than 2 phosphate groups in the same molecule, alkyne sulfonate with one sulfonate group or two or more than 2 sulfonate groups in the same molecule, alkyne carbonate with one carbonate group or two or more than 2 carbonate groups in the same molecule, alkyne phosphate with one phosphate group or two or more than 2 phosphate groups in the same molecule. The counter ions $M^+$ for these negative $R^-$ groups include, but are not limited to sodium ion, potassium ion, ammonium ion, and cesium ion.

The chemical additive used as Cu dishing reducers includes, but is not limited to the family of morpholino compounds or oligomers having the general molecular structure as shown below:

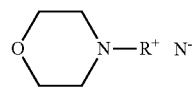

wherein, R represents various organic functional groups which attached to the nitrogen atom in morpholino 6-member ring through covalent boding with positive charges.

The $R^+$ organic functional groups include, but are not limited to, alkyl quaternary ammonium with one quaternary ammonium group or two or more than 2 quaternary ammonium groups in the same molecule, alkene quaternary ammonium with one quaternary ammonium group or two or more than 2 quaternary ammonium groups in the same molecule, alkyne quaternary ammonium with one quaternary ammonium group or two or more than 2 quaternary ammonium groups in the same molecule. The counter ions $N^-$ for these positive $R^+$ groups include, but are not limited to carbonate anion, sulfate anion or phosphate anion.

The biocide includes but is not limited to Kathon™, Kathon™ CG/ICP II, from Dow Chemical Co. They have active ingredients of 5-chloro-2-methyl-4-isothiazolin-3-one and 2-methyl-4-isothiazolin-3-one.

The oxidizing agent includes, but is not limited to, periodic acid, hydrogen peroxide, potassium iodate, potassium permanganate, ammonium persulfate, ammonium molybdate, ferric nitrate, nitric acid, potassium nitrate, and mixtures thereof.

The amino acids and amino acid derivatives included, but not limited to, glycine, D-alanine, L-alanine, DL-alanine, beta-alanine, valine, leucine, isolueciene, phenylamine, proline, serine, threonine, tyrosine, glutamine, asparanine, glutamic acid, aspartic acid, tryptophan, histidine, arginine, lysine, methionine, cysteine, iminodiacetic acid, and combinations thereof.

The organic amines chelators have general molecular structures, as depicted below:

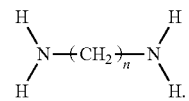

The organic amine molecules have two primary amine functional groups as terminal groups on both ends of the molecules. n is numbered from 2 to 12, such as ethylenediamine with n=2, propylenediamine with n=3, butylenediamine with n=4, etc.

The organic diamine compounds with two primary amine moieties can be described as the binary chelating agents.

The alkyl group which linked to two terminal primary amine functional groups also include the branched alkyl groups, the general molecular structures of these branched alkyl groups are depicted at followings:

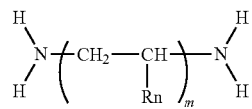

wherein, Rn represents an organic $C_1$ to $C_{12}$ alkyl group, m has the numbers ranged from 2 to 12.

The organic diamine molecules can also have the branched alkyl group as the linking group between two terminal primary amine functional groups.

Another structure of the organic amine molecules is shown below. Rn and Rm can be the same or different $C_1$ to $C_{12}$ alkyl groups. p is from 2 to 12.

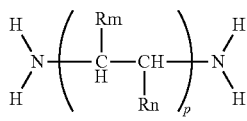

Another type of the branched alkyl group linker has the following general molecular structure:

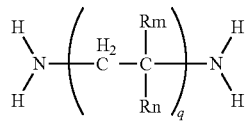

wherein, the Rn and Rm groups are bonded to the same carbon atom. Rn and Rm can be the same or different $C_1$ to $C_{12}$ alkyl groups. q is from 2 to 12.

The organic diamine molecules with other molecular structures can be also used as a chelating agent in the invented herein Cu CMP slurries, such as those organic diamine molecules with the following general molecular structures:

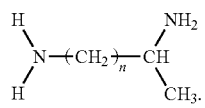

Such organic diamine molecules can have n numbered from 1 to 12, and can be described as organic diamines with one terminal primary amine functional group and another primary organic amine attached to the beta carbon atoms on the other end of the molecules. Also, the secondary primary amine functional groups can be also bonded to the other carbon atoms at other positions, such as beta, gamma etc. and the first primary amine function group still maintains as the terminal primary amine functional group in the same molecules.

Any other non-aromatic organic diamine molecules with two primary organic amine groups can be used as one of the three chelating agents in the invented Cu CMP slurries herein.

Optionally, any aromatic organic molecules with two primary amine functional groups can be used as one of three chelating agents in the invented Cu CMP slurries herein. For example, aromatic organic amines have the general molecular structures as depicted in followings:

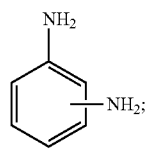

or as followings:

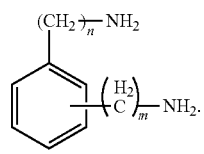

In the above listed general aromatic organic diamine structures with two primary amine functional groups at ortho or meta positions in which n can be from 1 to 12, and m also can be from 1 to 12, also in the same molecule(s), n can be equal to m. In other cases, n can also be different from m.

DETAILED DESCRIPTION OF THE INVENTION

As industry standards trend toward smaller device features, there is a continuously developing need for new Cu bulk metal polishing slurries that afford high and tunable Cu or other metal films such as Co, W, Al, Ni etc. removal rates and low Cu or metal line dishing for the broad and advanced node applications.

The copper bulk CMP or other metal film such as Co, W, Al, Ni etc. polishing compositions described herein satisfy the need for high and tunable Cu film removal rates, for high selectivity between copper and dielectric films, for high selectivity between copper and barrier films, for low and more uniform Cu line dishing across various wide Cu line features, and for better Cu film corrosion protection through using the suitable corrosion inhibitors.

The Cu CMP polishing compositions comprise tris chelators, dual chelators or single chelator, i.e. varied number(s) of chelating agents, an organic quaternary ammonium salt as additional Cu dishing and defect reducer, Cu corrosion inhibitor for the efficient Cu corrosion protection, abrasive such as nano-sized high purity colloidal silica, oxidizing agent such as hydrogen peroxide, and water as a solvent.

The Cu CMP polishing compositions provide high and tunable Cu removal rates, and low barrier film and dielectric film removal rates which provide very high and desirable selectivity of Cu film vs. other barrier films, such as Ta, TaN, Ti, and TiN, and dielectric films, such as TEOS, low-k, and ultra low-k films, and low Cu dishing and more uniform Cu dishing across wide Cu line features.

The invented herein Cu chemical mechanical polishing compositions also provide no pad stain Cu CMP performances which allow the extended polish pad life and also allow more stable end-point detections.

The abrasive particles used for the disclosed herein Cu or other metal film bulk CMP polishing compositions include, but are not limited to, the following: colloidal silica or high purity colloidal silica; the colloidal silica particles doped by other metal oxide within lattice of the colloidal silica, such as alumina doped silica particles; colloidal aluminum oxide including alpha-, beta-, and gamma-types of aluminum oxides; colloidal and photoactive titanium dioxide, cerium oxide, colloidal cerium oxide, nano-sized inorganic metal oxide particles, such as alumina, titania, zirconia, ceria etc; nano-sized diamond particles, nano-sized silicon nitride particles; mono-modal, bi-modal, multi-modal colloidal abrasive particles; organic polymer-based soft abrasives, surface-coated or modified abrasives, or other composite particles, and mixtures thereof.

The colloidal silica can be made from silicate salts, the high purity colloidal silica can be made from TEOS or TMOS. The colloidal silica or high purity colloidal silica can have narrow or broad particle size distributions with monomodel or multi-models, various sizes and various shapes including spherical shape, cocoon shape, aggregate shape and other shapes, The nano-sized particles also can have different shapes, such as spherical, cocoon, aggregate, and others.

The Cu bulk CMP polishing compositions of this invention preferably contain 0.0025 wt. % to 25 wt. % abrasives;

the preferred concentration of abrasives ranges from 0.0025 wt. % to 2.5 wt. %. The most preferred concentration of abrasives ranges from 0.005 wt. % to 0.15 wt. %.

An organic quaternary ammonium salt, includes but is not limited to choline salt, such as choline bicarbonate salt, or all other salts formed between choline and other anionic counter ions.

The choline salts can have the general molecular structures shown below:

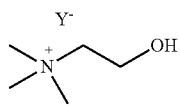

wherein anion $Y^-$ can be bicarbonate, hydroxide, p-toluene-sulfonate, bitartate, and other suitable anionic counter ions.

The CMP slurry contains 0.005 wt. % to 0.25 wt. % quaternary ammonium salt; the preferred concentration ranges from 0.001 wt. % to 0.05 wt. %; and the most preferred concentration ranges from 0.002 wt. % to 0.01 wt. %

Various per-oxy inorganic or organic oxidizing agents or other types of oxidizing agents can be used to oxidize the metallic copper film to the mixture of copper oxides to allow their quick reactions with chelating agents and corrosion inhibitors. The oxidizing agent includes, but is not limited to, periodic acid, hydrogen peroxide, potassium iodate, potassium permanganate, ammonium persulfate, ammonium molybdate, ferric nitrate, nitric acid, potassium nitrate, and mixtures thereof. The preferred oxidizer is hydrogen peroxide.

The CMP slurry contains 0.1 wt. % to 10 wt. % oxidizing agents; the preferred concentration ranges from 0.25 wt. % to 3 wt. %; and the most preferred concentration ranges from 0.5 wt. % to 2.0 wt. %

The corrosion inhibitors used for the disclosed copper bulk CMP slurry can be those prior arts reported corrosion inhibitors. The corrosion inhibitors include, but are not limited to family of hetero aromatic compounds containing nitrogen atom(s) in their aromatic rings, such as 1,2,4-triazole and derivatives, benzotriazole and benzotriazole derivatives, tetrazole and tetrazole derivatives, imidazole and imidazole derivatives, benzimidazole and benzimidazole derivatives, pyrazole and pyrazole derivatives, and tetrazole and tetrazole derivatives.

The CMP slurry contains 0.005 wt. % to 0.5 wt. % corrosion inhibitor; the preferred concentration ranges from 0.01 wt. % to 0.1 wt. %; and the most preferred concentration ranges from 0.025 wt. % to 0.05 wt. %.

A chemical additive which is selected from the family of morpholino compounds is used as a very effective Cu dishing reducing agent in herein disclosed polishing compositions.

The chemical additive used as Cu dishing reducers includes, but is not limited to the family of morpholino compounds or oligomers, having the general molecular structure as shown below:

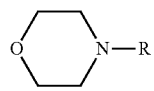

wherein, R represents hydrogen or various organic functional groups which attached to the nitrogen atom in morpholino 6-member ring through covalent boding with no net charges.

R includes, but is not limited to, alkyl primary amines with a single primary amine group or two or more than 2 primary amine groups in the same molecule, alkyl primary amines with a single secondary amine group or two or more than 2 secondary amine groups in the same molecule, alkyl amide with a single amide group or two or more than 2 amide groups in the same molecule, alkene primary amines with a single primary amine group or two or more than 2 primary amine groups in the same molecule, alkene primary amines with a single secondary amine group or two or more than 2 secondary amine groups in the same molecule, alkene amide with a single amide group or two or more than 2 amide groups in the same molecule, alkyne primary amines with a single primary amine group or two or more than 2 primary amine groups in the same molecule, alkyne primary amines with a single secondary amine group or two or more than 2 secondary amine groups in the same molecule, and alkyne amide with a single amide group or two or more than 2 amide groups in the same molecule.

R also includes, but is not limited to, alkyl alcohol with a single hydroxyl group or two or more than 2 hydroxyl groups in the same molecule, alkene alcohol with a single hydroxyl group or two or more than 2 hydroxyl groups in the same molecule, and alkyne alcohol with a single hydroxyl group or two or more than 2 hydroxyl groups in the same molecule.

The chemical additives covered with above listed general molecular structure include, but not limited to, 3-Morpholino-1,2-propanediol (MOPDIO), morpholine when R is hydrogen atom, 3,5-Dimethyl-morpholine, 2-(4-morpholino)phenol, 3-(4-morpholino)phenol, 4-(4-morpholino)phenol, 5-(4-Morpholinyl)-2-furaldehyde, 1-Morpholinocyclohexene, 2-methyl-2-morpholinopropanal, 4-(Morpholin-4-ylcarbonyl)benzonitrile, 5-(4-Morpholinylmethyl)-2-thiophenecarbaldehyde, 4-(2-hydroxyethyl)morpholine, 4-(3-hydroxypropyl)morpholine, 2-(2-Methoxyethyl)morpholine, 1-(4-Morpholinyl)-1-propanone, (2-morpholinophenyl)methanol, (4-morpholin-4-yl-phenyl)methanol, 1-morpholin-4-ylacetone, 2-(2-hydroxyethyl)morpholine, 2-(4-Morpholinylmethyl)phenol, 4-(2-Oxiranylmethyl)morpholine, Octahydrocyclopenta[b]morpholine, 2-(4-Morpholinyl)-2-oxoethanol, 3-morpholinecarboxylic acid methyl ester, 5-Ethyl-3-morpholinone, 4-(4-Morpholinyl) benzaldehyde, 2-morpholinobenzaldehyde, 2-morpholinonicotinaldehyde, 3-Phenyl-morpholine, 6-morpholinonicotinaldehyde, 6-morpholinopyridine-2-carbaldehyde, 4-(2-Aminoethyl)morpholine, 4-Morpholinecarbonitrile, 3-(4-Morpholinylcarbonyl)phenol, 4-(4-Morpholinylcarbonyl) phenol, Methyl-morpholin-2-ylmethyl-amine, ethyl morpholine-2-carboxylate, Ethyl morpholine-4-carboxylate, Borane morpholine complex, 1-Morpholinocyclopentene, 2-(4-morpholino)benzonitrile, 2-(Aminomethyl)morpholine, morpholin-2-yl(pyridin-4-yl)methanol, 1-morpholin-4-ylmethyl-cyclohexylamine, 2-N-Morpholinoethyl methacrylate, 4-Morpholinoaniline, 4-Morpholinopiperidine, 4-Morpholinopyridine, 4'-Morpholinoacetophenone, (2-morpholin-4-yl-1-phenylethyl)methylamine, (2-morpholin-4-yl-1-phenylethyl)methylamine, 1-Morpholinohexane-1,3-dione, etc.

The preferred chemical additive is selected from the group consisting of 3-Morpholino-1,2-propanediol (MOPDIO), morpholine when R is hydrogen atom, 2-methyl-2-morpholinopropanal, 4-(2-hydroxyethyl)morpholine, 4-(3- hydroxypropyl)morpholine, (2-morpholinophenyl) methanol, 2-(2-hydroxyethyl)morpholine, 2-(4-Morpholinyl)-2-oxoethanol, 4-(2-Aminoethyl)morpholine, 2-(Aminomethyl)morpholine, morpholin-2-yl(pyridin-4-yl) methanol, 1-morpholin-4-ylmethyl-cyclohexylamine, 1-Morpholinohexane-1,3-dione, etc.

The chemical additive used as Cu dishing reducers includes, but is not limited to the family of morpholino compounds or oligomers having the general molecular structure as shown below:

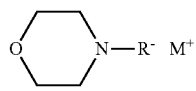

wherein, $R^-$ represents various organic functional groups which attached to the nitrogen atom in morpholino 6-member ring through covalent boding with negative charges.

The $R^-$ organic functional groups include, but are not limited to, alkyl sulfonate with one sulfonate group or two or more than 2 sulfonate groups in the same molecule, alkyl carbonate with one carbonate group or two or more than 2 carbonate groups in the same molecule, alkyl phosphate with one phosphate group or two or more than 2 phosphate groups in the same molecule, alkene sulfonate with one sulfonate group or two or more than 2 sulfonate groups in the same molecule, alkene carbonate with one carbonate group or two or more than 2 carbonate groups in the same molecule, alkene phosphate with one phosphate group or two or more than 2 phosphate groups in the same molecule, alkyne sulfonate with one sulfonate group or two or more than 2 sulfonate groups in the same molecule, alkyne carbonate with one carbonate group or two or more than 2 carbonate groups in the same molecule, alkyne phosphate with one phosphate group or two or more than 2 phosphate groups in the same molecule. The counter ions $M^+$ for these negative $R^-$ groups include, but are not limited to sodium ion, potassium ion, ammonium ion, and cesium ion.

The chemical additive used as Cu dishing reducers includes, but is not limited to the family of morpholino compounds or oligomers having the general molecular structure as shown below:

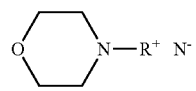

wherein, R represents hydrogen or any one of various organic functional groups which attached to the nitrogen atom in morpholino 6-member ring through covalent boding with positive charges.

The $R^+$ organic functional groups include, but are not limited to, alkyl quaternary ammonium with one quaternary ammonium group or two or more than 2 quaternary ammonium groups in the same molecule, alkene quaternary ammonium with one quaternary ammonium group or two or more than 2 quaternary ammonium groups in the same molecule, alkyne quaternary ammonium with one quaternary ammonium group or two or more than 2 quaternary ammonium groups in the same molecule. The counter ions $N^-$ for these positive $R^+$ groups include, but are not limited to carbonate anion, sulfate anion or phosphate anion.

The preferred dishing reducing additive is 3-Morpholino-1,2-propanediol (MOPDIO).

The CMP slurry contains 0.001 wt. % to 0.5 wt. % a Cu dishing reducing additive which is selected from the family of morpholino compounds; the preferred concentration ranges from 0.0025 wt. % to 0.25 wt. %; and the most preferred concentration ranges from 0.01 wt. % to 0.1 wt. %.

A biocide having active ingredients for providing more stable shelf time of the invented Cu chemical mechanical polishing compositions can be used.

The biocide includes but is not limited to Kathon™, Kathon™ CG/ICP II, from Dow Chemical Co. They have active ingredients of 5-chloro-2-methyl-4-isothiazolin-3-one and 2-methyl-4-isothiazolin-3-one.

The CMP slurry contains 0.0001 wt. % to 0.05 wt. % biocide; the preferred concentration ranges from 0.0001 wt. % to 0.025 wt. %; and the most preferred concentration ranges from 0.002 wt. % to 0.01 wt. %

Optionally, acidic or basic compounds or pH adjusting agents can be used to allow pH of Cu bulk CMP polishing compositions being adjusted to the optimized pH value, The pH adjusting agents include, but are not limited to, the following: nitric acid, hydrochloric acid, sulfuric acid, phosphoric acid, other inorganic or organic acids, and mixtures thereof for acidic pH conditions; or sodium hydride, potassium hydroxide, ammonium hydroxide, tetraalkyl ammonium hydroxide, organic amines, and other chemical reagents that are able to be used to adjust pH towards the more alkaline direction.

The CMP slurry contains 0 wt. % to 1 wt. % pH adjusting agent; the preferred concentration ranges from 0.01 wt. % to 0.5 wt. %; and the most preferred concentration ranges from 0.1 wt. % to 0.25 wt. % pH of the Cu polishing compositions is from about 3.0 to about 12.0; preferred pH range is from 5.5 to 7.5; and the most preferred pH range is from 7.0 to 7.35.

The single or dual or three chelator(s) are selected from the group consisting of amino acids, amino acid derivatives, organic amine, and combinations therefor; wherein at least one chelator is an amino acid or an amino acid derivative. For example, the three or tris-chelators, can be the combination of any three amino acids, three amino acid derivatives, or two amino acids plus one organic amine, or one amino acid plus one amino acid derivative plus one organic amine, or two organic amines plus one amino acid, and or two organic amines plus one amino acid derivative. As a specific example, the tris chelators can be glycine, alanine and ethylenediamine.

At least one chelator, such as dual or tris chelator, were used as complexing agents to maximize their reactions with the oxidized Cu film surfaces to form softer Cu-chelator layers to be quickly removed during Cu CMP process thus achieving high and tunable Cu removal rates and low copper dishing for the broad or advanced node copper or TSV (Through Silica Via) CMP applications.

The amino acids and amino acid derivatives included, but not limited to, glycine, D-alanine, L-alanine, DL-alanine, beta-alanine, valine, leucine, isolueciene, phenylamine, proline, serine, threonine, tyrosine, glutamine, asparanine, glutamic acid, aspartic acid, tryptophan, histidine, arginine, lysine, methionine, cysteine, iminodiacetic acid, etc.

The organic amines chelators have general molecular structures, as depicted below:

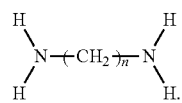

The organic amine molecules have two primary amine functional groups as terminal groups on both ends of the molecules. n is numbered from 2 to 12, such as ethylenediamine with n=2, propylenediamine with n=3, butylenediamine with n=4, etc.

The organic diamine compounds with two primary amine moieties can be described as the binary chelating agents.

The alkyl group which linked to two terminal primary amine functional groups also include the branched alkyl groups, the general molecular structures of these branched alkyl groups are depicted at followings:

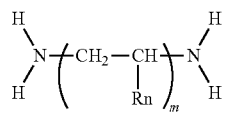

wherein, Rn represents an organic $C_1$ to $C_{12}$ alkyl group, m has the numbers ranged from 2 to 12.

The organic diamine molecules can also have the branched alkyl group as the linking group between two terminal primary amine functional groups.

Another structure of the organic amine molecules is shown below. Rn and Rm can be the same or different $C_1$ to $C_{12}$ alkyl groups.

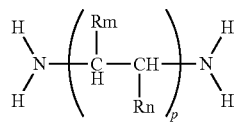

Another type of the branched alkyl group linker has the following general molecular structure:

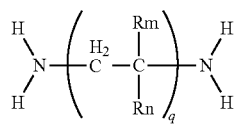

wherein, the Rn and Rm groups are bonded to the same carbon atom. Rn and Rm can be the same or different $C_1$ to $C_{12}$ alkyl groups. q is from 2 to 12.

The organic diamine molecules with other molecular structures can be also used as a chelating agent in the invented herein Cu CMP slurries, such as those organic diamine molecules with the following general molecular structures:

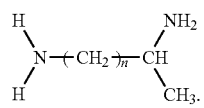

Such organic diamine molecules can have n numbered from 1 to 12, and can be described as organic diamines with one terminal primary amine functional group and another primary organic amine attached to the beta carbon atoms on the other end of the molecules. Also, the secondary primary amine functional groups can be also bonded to the other carbon atoms at other positions, such as beta, gamma etc.

and the first primary amine function group still maintains as the terminal primary amine functional group in the same molecules.

Any other non-aromatic organic diamine molecules with two primary organic amine groups can be used as one of the three chelating agents in the invented Cu CMP slurries herein.

Optionally, any aromatic organic molecules with two primary amine functional groups can be used as one of three chelating agents in the invented Cu CMP slurries herein. For example, aromatic organic amines have the general molecular structures as depicted in followings:

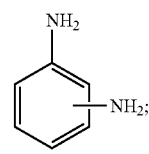

or as followings:

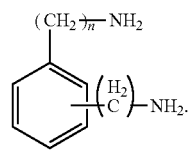

In the above listed general aromatic organic diamine structures with two primary amine functional groups at ortho or meta positions in which n can be from 1 to 12, and m also can be from 1 to 12, also in the same molecule(s), n can be equal to m. In other cases, n can also be different from m.

Typical amine used includes but is not limited to ethylenediamin, propylenediamine, butylenediamine, pentalene diamine, hexylene.

The chelator(s) concentrations are ranged from 0.25 wt. % to 5.0 wt. %, the preferred concentrations are ranged from 0.5 wt. % to 2.5 wt. %, the more preferred concentrations are ranged from 1.0 wt. % to 2.0 wt. %.

The associated methods described herein entail use of the aforementioned composition for chemical mechanical planarization of substrates comprised of copper. In the methods, a substrate (e.g., a wafer with Cu surface or Cu plug) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The polishing composition and associated methods described herein are effective for CMP of a wide variety of substrates, including most of substrates having, particularly useful for polishing copper substrates.

Experimental Section

Polishing Pad Polishing pad, IC1010 pad or Other polishing pad was used during Cu CMP, supplied by Dow Chemicals Company.

Parameters:
   Å: angstrom(s)—a unit of length
   BP: back pressure, in psi units
   CMP: chemical mechanical planarization=chemical mechanical polishing
   CS: carrier speed
   DF: Down force: pressure applied during CMP, units psi
   min: minute(s)
   ml: milliliter(s)
   mV: millivolt(s)
   psi: pounds per square inch
   PS: platen rotational speed of polishing tool, in rpm (revolution(s) per minute)
   SF: polishing composition flow, ml/min
Removal Rates

| | |
|---|---|
| Cu RR 1.5 psi | Measured Copper removal rate at 1.5 psi down pressure of the CMP tool |
| Cu RR 2.5 psi | Measured Copper removal rate at 2.5 psi down pressure of the CMP tool |

General Experimental Procedure

All percentages are weight percentages unless otherwise indicated. In the examples presented below, CMP experiments were run using the procedures and experimental conditions given below. The CMP tool that was used in the examples is a 300 mm LK® polisher, or a Mirra® polisher, manufactured by Applied Materials, 3050 Boweres Avenue, Santa Clara, Calif., 95054. An IC1010 pad or other type of polishing pad, supplied by Dow Chemicals Company was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket Cu wafers with 10.8K Angstroms in thickness, Ta and TEOS blanket wafers. These blanket wafers were purchased from Silicon Valley Microelectronics, 1150 Campbell Ave, CA, 95126.

WORKING EXAMPLE

In following working examples, the Cu slurry composition with single chelator which was used as reference sample comprised 0.713 wt. % of glycine, 0.0323 wt. % of 1,2,4-triazole, 0.00644 wt. % of high purity colloidal silica, and 0.00018 wt. % of biocide. The invented herein new Cu slurry #1 and #2 comprised 0.713 wt. % of glycine, 0.0323 wt. % of 1,2,4-triazole, 0.00644 wt. % of high purity colloidal silica, 0.00018 wt. % of biocide, and a Cu dishing reducing additive, 0.025 wt. % or 0.50 wt. % of 3-Morpholino-1,2-propanediol (MOPDIO). The pH of the slurries were at 6.0 to 7.5.

All these three listed formulations used 1.0 wt. % of $H_2O_2$ as oxidizing agent at point of use, respectively Example 1

The polish results of using the Cu bulk CMP polishing compositions, reference sample vs new Cu slurry #1 and new Cu slurry #2 were listed in Table 1 and depicted in FIG. 1.

TABLE 1

The Effects of Chemical Additive MOPDIO in Single Chelator Cu Slurries on Cu Removal Rates

| Sample | Cu Removal (Å/min.) at 1.5 psi DF | Cu Removal Rate (Å/min.) at 2.5 psi DF |
|---|---|---|
| Reference Slurry single chelator (Glycine) | 4643 | 8186 |
| Slurry# 1 single chelator Glycine + 0.025 wt. % 3-Morpholino-1,2-propanediol | 5120 | 8367 |
| Slurry# 2 single chelator Glycine + 0.05 wt. % 3-Morpholino-1,2-propanediol | 4637 | 7624 |

Three CMP polishing compositions using single chelator were listed in Table 1. The reference slurry using glycine as the chelator but not using any Cu dishing additive.

New Cu slurry #1 and Cu slurry #2 were formulations using glycine as the chelator and different concentrations of 3-Morpholino-1,2-propanediol (=MOPDIO) as the chemical additive and Cu dishing reducer in compositions.

The Cu CMP polishing compositions with 0.025% or 0.50% 3-Morpholino-1,2-propanediol as Cu dishing reducing additive both afforded high and compatible Cu film removal rates comparing with the single chelator glycine based Cu CMP polishing composition. With 0.025% 3-Morpholino-1,2-propanediol as Cu dishing reducing additive, the Cu removal rates were higher than the Cu removal rates obtained using the reference sample without the use of any Cu dishing reducing additive.

Figure 2:
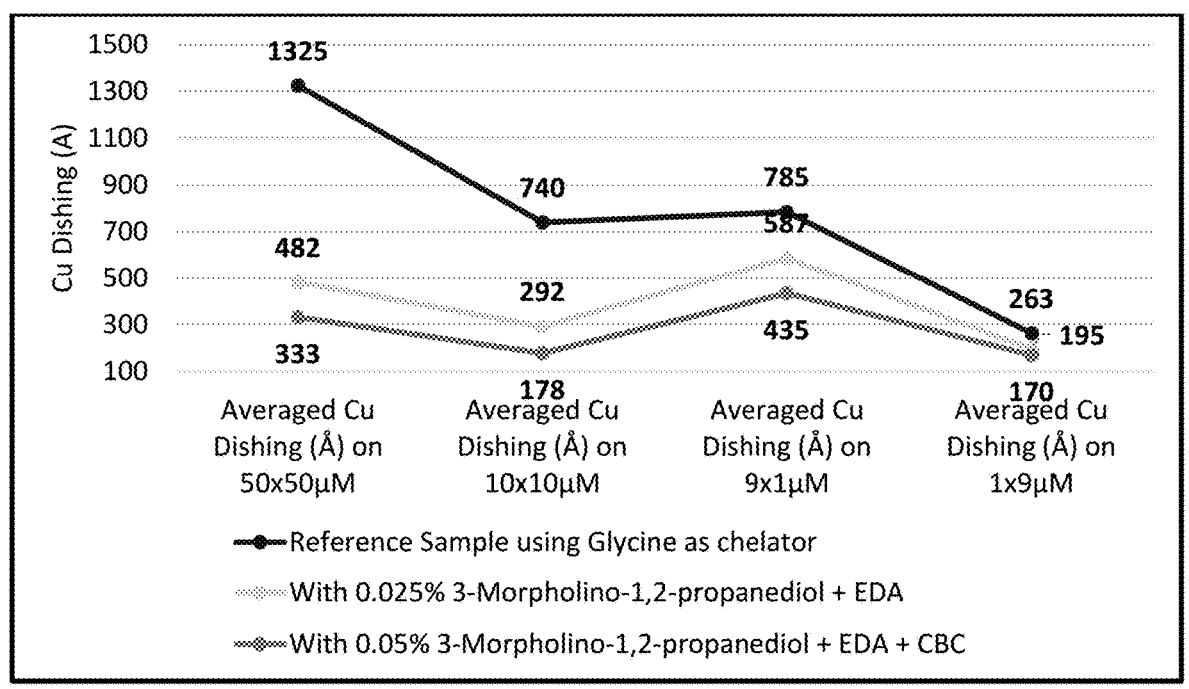
FIG. 2 shows Cu dishing results from formulations using single chelator (as the reference sample), dual chelators; and dual chelators with a chemical additive as Cu dishing reducer

The dishing effects of Cu CMP polishing compositions with 0.025% or 0.50% 3-Morpholino-1,2-propanediol as Cu dishing reducing additive herein vs the reference Cu CMP polishing composition without using such Cu dishing reducing additive on various featured Cu lines were listed in Table 2 and depicted in FIG. 2.

TABLE 2

Effects of Cu Dishing Additive on Cu Dishing with Glycine-only Cu Slurries

| Samples | Averaged Cu Dishing (Å) on 50 × 50 μM | Averaged Cu Dishing (Å) on 10 × 10 μM | Averaged Cu Dishing (Å) on 9 × 1 μM | Averaged Cu Dishing (Å) on 1 × 9 μM |
|---|---|---|---|---|
| Reference Slurry single chelator (Glycine) | 1325 | 740 | 785 | 263 |
| Slurry #1 | 609 | 432 | 649 | 244 |
| Slurry #2 | 425 | 230 | 530 | 159 |

The Cu dishing reduction percentages on 50×50 μM and 10×10 μM Cu line features were listed in Table 3.

TABLE 3

Effects of Cu Dishing Additive on Cu Dishing with Single Chelator Glycine

| Samples | Averaged Cu Dishing (Å) on 50×50 μM | Averaged Cu Dishing (Å) Reduction % on 50×50 μM | Averaged Cu Dishing (Å) on 10×10 μM | Averaged Cu Dishing (Å) Reduction % on 10×10 μM |
|---|---|---|---|---|
| Reference Slurry single chelator (Glycine) | 1325 | — | 740 | — |
| Slurry #1 | 609 | −54% | 432 | −42% |
| Slurry #2 | 425 | −68% | 230 | −69% |

As showed in Table 3, when 0.025 wt. % of 3-Morpholino-1,2-propanediol was used in the compositions, the Cu dishing has been reduced by −54% on 50×50 μM Cu line feature and by −42% on 10×10 μM Cu line feature. When 3-Morpholino-1,2-propanediol used at 0.05 wt. %, the Cu dishing has been reduced by −68% on 50×50 μM Cu line feature and by −69% on 10×10 μM Cu line feature.

The Cu dishing reduction percentages on 9×1 μM and 1×9 μM Cu line features were listed in Table 4.

TABLE 4

Effects of Cu Dishing Additive on Cu Dishing with Single Chelator Glycine

| Samples | Averaged Cu Dishing (Å) on 9×1 μM | Averaged Cu Dishing (Å) Reduction % on 9×1 μM | Averaged Cu Dishing (Å) on 1×9 μM | Averaged Cu Dishing (Å) Reduction % on 1×9 μM |
|---|---|---|---|---|
| Reference Slurry single chelator (Glycine) | 785 | — | 263 | — |
| Slurry #1 | 649 | −17.3% | 244 | −7.2% |
| Slurry #2 | 530 | −32.5% | 159 | −39.5% |

As showed in Table 4, the Cu dishing has been reduced by −33% on 9×1 μM Cu line feature and by −40% on 1×9 μM Cu line feature when 0.05 wt. % of 3-Morpholino-1,2-propanediol used.

Example 2

Figure 3:
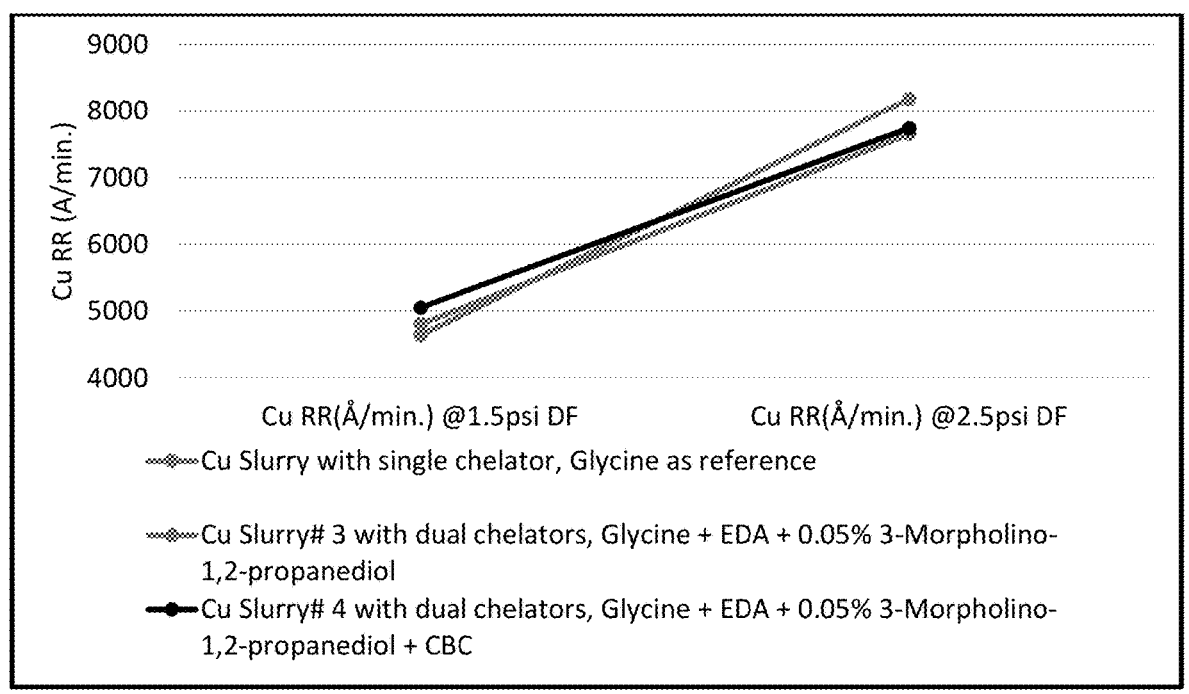
FIG. 3 shows Cu polishing results from formulations using single chelator (the reference sample), dual chelators, and dual chelators with a chemical additive as Cu dishing reducer

The polish results of using the Cu bulk CMP polishing compositions, reference sample vs new Cu slurry #3 and new Cu slurry #4 were listed in Table 5 and depicted in FIG. 3. The pH of the slurries were at 6.0 to 7.5.

The dual chelators formulations slurry #3 and Slurry #4 both used glycine and ethylenediamine (EDA) as the dual chelators, and 3-Morpholino-1,2-propanediol (=MOPDIO) as Cu dishing reducer. In addition, Choline Bicarbonate (CBC) was used in Cu Slurry #4.

TABLE 5

The Effects of Chemical Additive MOPDIO in Dual Chelator Cu Slurries on Cu Removal Rates

| Sample | Cu Removal (Å/min.) at 1.5 psi DF | Cu Removal Rate (Å/min.) at 2.5 psi DF |
|---|---|---|
| Reference Slurry single chelator(Glycine) | 4643 | 8186 |
| Cu Slurry# 3 dual chelators, Glycine + EDA + 0.05 wt % 3-Morpholino-1,2-propanediol | 4809 | 7656 |
| Cu Slurry# 4 dual chelators, Glycine + EDA + 0.05 wt % 3-Morpholino-1,2-propanediol + CBC | 5057 | 7745 |

The Cu CMP polishing compositions with 0.050 wt. % 3-Morpholino-1,2-propanediol as Cu dishing reducing additive afforded high and compatible Cu film removal rates comparing with the single chelator glycine based Cu CMP polishing composition. With 0.05 wt. % 3-Morpholino-1,2-propanediol as Cu dishing reducing additive and EDA as second chelator, Cu removal rate at 1.5 psi DF was increased, the addition of CBC in Cu slurry #4 increased Cu removal rate further at 1.5 psi DF.

Figure 4:
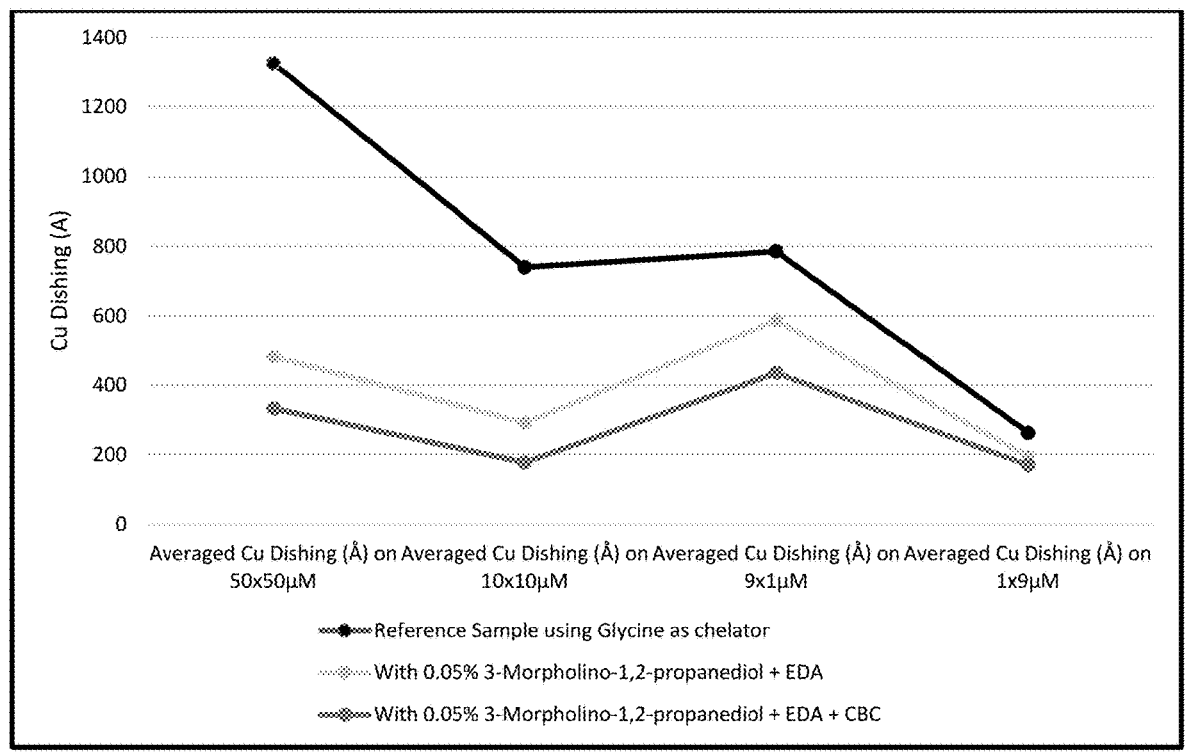
FIG. 4 shows Cu dishing results from formulations using single chelator the reference sample), dual chelators, and dual chelators with a chemical additive as Cu dishing reducer

The dishing effects of Cu CMP polishing compositions from Reference sample (single chelator with no Cu dishing additive), Cu slurry #3 and #4 were listed in Table 6 and depicted in FIG. 4.

TABLE 6

Effects of Cu Dishing Additive on Cu Dishing with Dual Chelator

| Samples | Averaged Cu Dishing (Å) on 50×50 μM | Averaged Cu Dishing (Å) on 10×10 μM | Averaged Cu Dishing (Å) on 9×1 μM | Averaged Cu Dishing (Å) on 1×9 μM |
|---|---|---|---|---|
| Reference Sample | 1325 | 740 | 785 | 263 |
| Cu Slurry #3 | 482 | 292 | 587 | 195 |
| Cu Slurry #4 | 333 | 178 | 435 | 170 |

The Cu dishing reduction percentages on 50×50 μM and 10×10 μM Cu line features were listed in Table 7.

TABLE 7

Effects of Cu Dishing Additive on Cu Dishing with Dual Chelators

| Samples | Averaged Cu Dishing (Å) on 50×50 μM | Averaged Cu Dishing (Å) Reduction % on 50×50 μM | Averaged Cu Dishing (Å) on 10×10 μM | Averaged Cu Dishing (Å) Reduction % on 10×10 μM |
|---|---|---|---|---|
| Reference Sample | 1325 | — | 740 | — |
| Cu Slurry #3 | 482 | −64% | 292 | −61% |
| Cu Slurry #4 | 333 | −75% | 178 | −76% |

As showed in Table 7, the use of 0.05 wt. % 3-Morpholino-1,2-propanediol in glycine and EDA based dual chelator Cu slurry #3, Cu dishing has been reduced the by −64% on 50×50 μM Cu line feature and by −61% on 10×10 μM Cu line feature. When used at 0.05 wt. % in glycine and EDA based dual chelator plus Choline Bicarbonate (CBC) Cu slurry #4 as an additional additive, the Cu dishing were reduced by −75% on 50×50 μM Cu line feature and by −76% on 10×10 μM Cu line feature.

The Cu dishing reduction percentages on 9×1 μM and 1×9 μM Cu line features were listed in Table 8.

TABLE 8

Effects of Cu Dishing Additive on Cu Dishing with Dual Chelators

| Samples | Averaged Cu Dishing (Å) on 9 × 1 μM | Averaged Cu Dishing (Å) Reduction % on 9 × 1 μM | Averaged Cu Dishing (Å) on 1 × 9 μM | Averaged Cu Dishing (Å) Reduction % on 1 × 9 μM |
|---|---|---|---|---|
| Reference Sample | 785 | — | 263 | — |
| Cu Slurry #3 | 587 | −25.2% | 195 | −25.8% |
| Cu Slurry #3 | 435 | −44.6% | 170 | −33.4% |

As showed in Table 8, the Cu dishing were reduced by −25% on 9×1 μM Cu line feature and by −26% on 1×9 μM Cu line feature respectively using Cu slurry #3, when 3-Morpholino-1,2-propanediol was used in addition of glycine and EDA based dual chelators.

The Cu dishing were reduced by −45% on 9×1 μM Cu line feature and by −33% on 1×9 μM Cu line feature respectively using Cu slurry #4 wherein 3-Morpholino-1,2-propanediol as well as CBC were used in addition of glycine and EDA based dual chelators.

Example 3

Figure 5:
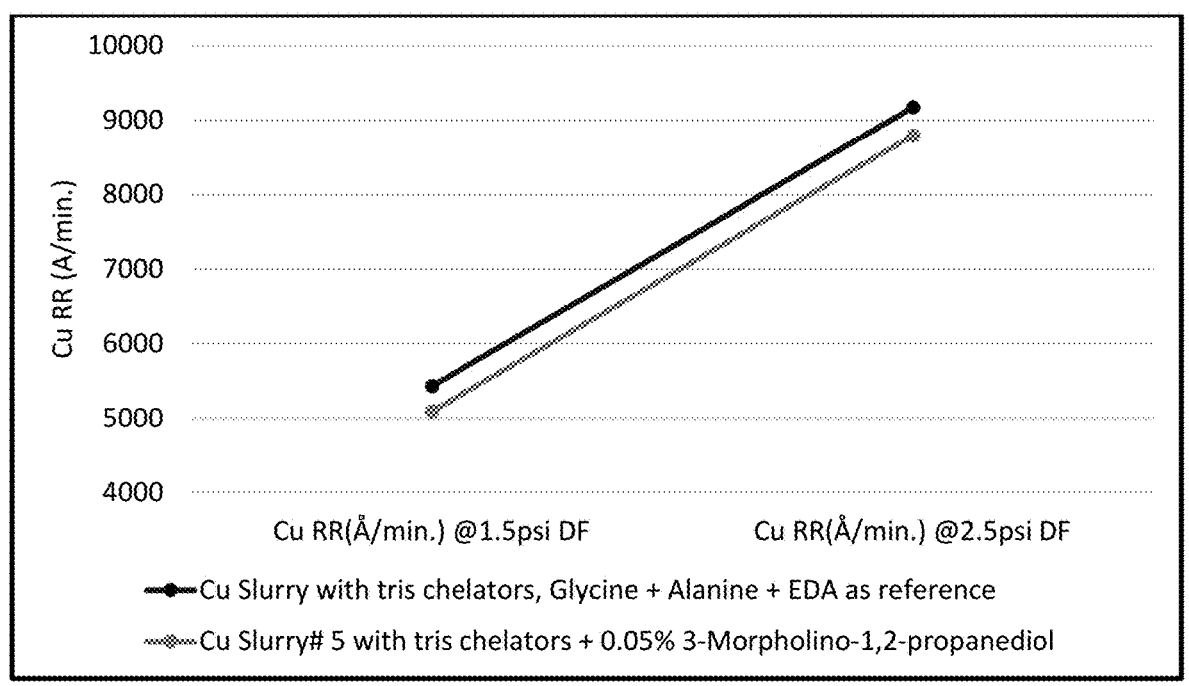
FIG. 5 shows Cu polishing results from formulations using tris chelator vs tris chelator with a chemical additive as Cu dishing reducer

The polishing effects of the tris chelator based Cu CMP polishing compositions with/or without using 3-Morpholino-1,2-propanediol as an additional additive to reduce Cu line dishing were shown in Table 9 and depicted in FIG. 5. The pH of the compositions were at 6.0 to 7.5.

TABLE 9

The Effects of Chemical Additive MOPDIO in Tris Chelator Cu Slurries on Cu Removal Rates

| Sample | Averaged Cu Removal Rate (Å/min.) at 1.5 psi DF | Averaged Cu Removal Rate (Å/min.) at 2.5 psi DF |
|---|---|---|
| Cu Slurry with tris chelators, Glycine + Alanine + EDA as reference | 5432 | 9171 |
| Cu Slurry# 5 with tris chelators above + 0.05 wt. % 3-Morpholino-1,2-propanediol | 5093 | 8790 |

The use of 0.05 wt. % 3-Morpholino-1,2-propanediol (MOPDIO) as Cu dishing reducing additive in tris chelators based composition Cu slurry #5, a slightly reduced Cu removal rate was observed comparing with the reference sample having the three chelators but without using the additive. However, the Cu slurry #5 still afforded high averaged Cu removal rates at high or low down forces.

Figure 6:
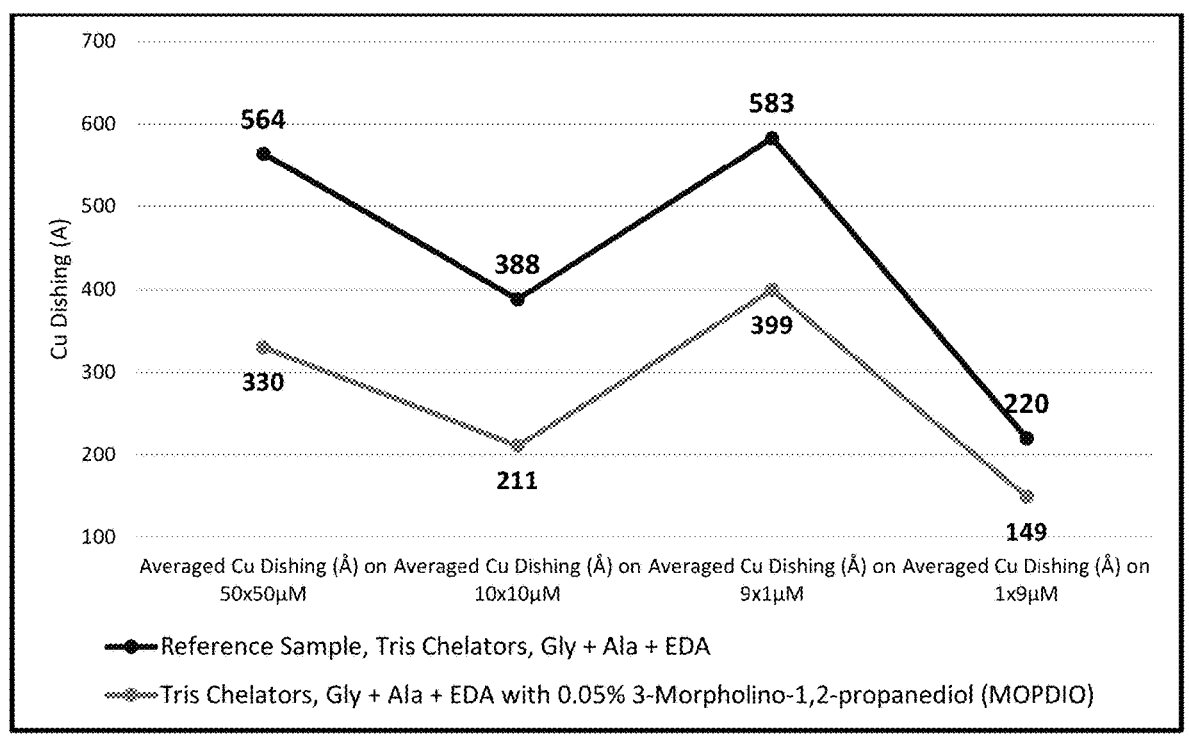
FIG. 6 shows Cu dishing results from formulations using tris chelator vs tris chelator with a chemical additive as Cu dishing reducer

The dishing effects of Cu CMP polishing compositions with 0.050 wt. % 3-Morpholino-1,2-propanediol (=MOPDIO) as Cu dishing reducing additive in the tris chelators, glycine and alanine and EDA based Cu slurry #5 vs the reference tris chelators based Cu CMP polishing composition without using such Cu dishing reducing additive on various featured Cu line dishing were listed in Table 10 and depicted in FIG. 6.

TABLE 10

Effects of Cu Dishing Additive on Cu Dishing with Tris Chelator Cu Slurry

| Samples | Averaged Cu Dishing (Å) on 50 × 50 μM | Averaged Cu Dishing (Å) on 10 × 10 μM | Averaged Cu Dishing (Å) on 9 × 1 μM | Averaged Cu Dishing (Å) on 1 × 9 μM |
|---|---|---|---|---|
| Reference Sample | 564 | 388 | 583 | 220 |
| Cu Slurry #5 | 330 | 211 | 399 | 149 |

The Cu dishing reduction percentages on 50×50 μM and 10×10 μM Cu line features using Cu slurry #5 were compared with the reference tris chelators based Cu CMP polishing composition and results were listed in Table 11.

TABLE 11

Effects of Cu Dishing Additive on Cu Dishing with Tris Chelators Cu Slurries

| Samples | Averaged Cu Dishing (Å) on 50 × 50 μM | Averaged Cu Dishing (Å) Reduction % on 50 × 50 μM | Averaged Cu Dishing (Å) on 10 × 10 μM | Averaged Cu Dishing (Å) Reduction % on 10 × 10 μM |
|---|---|---|---|---|
| Reference Sample, Tris Chelators | 564 | — | 388 | — |
| Cu Slurry #5 | 330 | −41.5% | 211 | −45.6% |

As showed in Table 11, the Cu dishing were reduced by about −42% on 50×50 μM Cu line feature and by about −46% on 10×10 μM Cu line feature, when 0.05 wt. % of 3-Morpholino-1,2-propanediol was used in the formulation Cu slurry #5.

The Cu dishing reduction percentages on 9×1 μM and 1×9 μM Cu line features using Cu slurry #5 vs using the reference sample with tris chelators were listed in Table 12.

TABLE 12

Effects of Cu Dishing Additive on Cu Dishing with Tris Chelators Cu Slurries

| Samples | Averaged Cu Dishing (Å) on 9 × 1 μM | Averaged Cu Dishing (Å) Reduction % on 9 × 1 μM | Averaged Cu Dishing (Å) on 1 × 9 μM | Averaged Cu Dishing (Å) Reduction % on 1 × 9 μM |
|---|---|---|---|---|
| Reference Sample, Tris Chelators | 583 | — | 220 | — |
| Cu Slurry #5 | 399 | −31.6% | 149 | −32.3% |

As showed in Table 12, the Cu dishing from Cu slurry #5 was reduced by about −32% on 9×1 μM Cu line feature and by about −32% on 1×9 μM Cu line feature comparing with the dishing from the reference sample.

While the invention has been described in conjunction with specific embodiments thereof, it is evident that many alternatives, modifications, and variations will be apparent to those skilled in the art in light of the foregoing description. Accordingly, departures may be made from such details without departing from the spirit or scope of the general inventive concept.

While the principles of the invention have been described above in connection with preferred embodiments, it is to be clearly understood that this description is made only by way of example and not as a limitation of the scope of the invention.

The invention claimed is:
1. A metal film bulk chemical mechanical polishing (CMP) or Through Silica Via (TSV) composition comprises:
   a) Abrasive ranging from 0.0025 wt. % to 2.5 wt. % and is selected from the group consisting of colloidal silica or high purity colloidal silica, colloidal silica particles doped by other metal oxide within lattice of the colloidal silica, colloidal aluminum oxide, colloidal and photoactive titanium dioxide, cerium oxide, colloidal cerium oxide, nano-sized inorganic metal oxide particles, nano-sized diamond particles, nano-sized silicon nitride particles, mono-modal colloidal abrasive particles, bi-modal colloidal abrasive particles, multi-modal colloidal abrasive particles, organic polymer-based soft abrasives, surface-coated or modified abrasives, and combinations thereof;
   b) at least one chelator ranging from 0.5 wt. % to 2.5 wt. % and is selected from the group consisting of amino acids, amino acid derivatives, organic amine, and combinations therefor; wherein at least one of the at least one chelator is an amino acid or an amino acid derivative;
   c) corrosion inhibitor ranging from 0.01 wt. % to 0.1 wt. % and is selected from the group consisting of 1,2,4-triazole and derivatives, benzotriazole and benzotriazole derivatives, tetrazole and tetrazole derivatives, imidazole and imidazole derivatives, benzimidazole and benzimidazole derivatives, pyrazole and pyrazole derivatives, tetrazole and tetrazole derivatives, and combinations thereof;
   d) a chemical additive;
   e) oxidizing agent ranging from 0.25 wt. % to 3 wt. %; and is selected from the group consisting of periodic acid, hydrogen peroxide, potassium iodate, potassium permanganate, ammonium persulfate, ammonium molybdate, ferric nitrate, nitric acid, potassium nitrate, and combinations thereof; and
   f) water based solvent selected from the group consisting of deionized (DI) water, distilled water, and water based alcoholic organic solvent;
   optionally
   g) biocide ranging from 0.0001 wt. % to 0.025 wt. % and has active ingredients of 5-chloro-2-methyl-4-isothiazolin-3-one and 2-methyl-4-isothiazolin-3-one;
   h) organic quaternary ammonium salt; and
   i) pH adjusting agent;
   wherein
   the pH of the composition is 5.5 to 8.0;
   the metal film is selected from the group consisting of Cu film, Co film, W film, Ni film, Al film, and combinations thereof; and
   the chemical additive ranges from 0.0025 wt. % to 0.25 wt. % and is a morpholino compound or oligomer having a molecular structure selected from the group consisting of

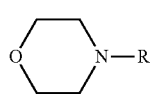

(a)

wherein R is hydrogen or an organic functional group attached to the nitrogen atom in morpholino 6-member ring through covalent boding with no net charges; and R is selected from the group consisting of alkyl primary amine with a single primary amine group or two or more than 2 primary amine groups in the same molecule; alkyl primary amine with a single secondary amine group or two or more than 2 secondary amine groups in the same molecule; alkyl amide with a single amide group or two or more than 2 amide groups in the same molecule; alkene primary amine with a single primary amine group or two or more than 2 primary amine groups in the same molecule; alkene primary amine with a single secondary amine group or two or more than 2 secondary amine groups in the same molecule; alkene amide with a single amide group or two or more than 2 amide groups in the same molecule; alkyne primary amine with a single primary amine group or two or more than 2 primary amine groups in the same molecule; alkyne primary amine with a single secondary amine group or two or more than 2 secondary amine groups in the same molecule; alkyne amide with a single amide group or two or more than 2 amide groups in the same molecule; alkyl alcohol with a single hydroxyl group or two or more than 2 hydroxyl groups in the same molecule; alkene alcohol with a single hydroxyl group or two or more than 2 hydroxyl groups in the same molecule; and alkyne alcohol with a single hydroxyl group or two or more than 2 hydroxyl groups in the same molecule;

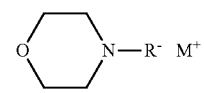

(b)

wherein $R^-$ is an organic functional group attached to the nitrogen atom in morpholino 6-member ring through covalent boding with negative charges; and $R^-$ is selected from the group consisting of alkyl sulfonate with one sulfonate or two or more than 2 sulfonate groups in the same molecule, alkyl carbonate with one carbonate group or two or more than 2 carbonate groups in the same molecule, alkyl phosphate with one phosphate group or two or more than 2 phosphate groups in the same molecule, alkene sulfonate with one sulfonate group or two or more than 2 sulfonate groups in the same molecule, alkene carbonate with one carbonate group or two or more than 2 carbonate groups in the same molecule, alkene phosphate with one phosphate group or two or more than 2 phosphate groups in the same molecule, alkyne sulfonate with one sulfonate group or two or more than 2 sulfonate groups in the same molecule, alkyne carbonate with one carbonate group or two or more than 2 carbonate groups in the same molecule, alkyne phosphate with one phosphate group or two or more than 2 phosphate groups in the same molecule; and counter ion $M^+$ for $R^-$ group is selected from the group consisting of sodium ion, potassium ion, ammonium ion, and cesium ion;

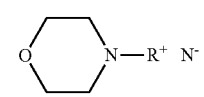

(c)

wherein $R^+$ is an organic functional group attached to the nitrogen atom in morpholino 6-member ring through covalent boding with positive charges; and R⁺ is selected from the group consisting of alkyl quaternary ammonium with one quaternary ammonium group or two or more than 2 quaternary ammonium groups in the same molecule, alkene quaternary ammonium with one quaternary ammonium group or two or more than 2 quaternary ammonium groups in the same molecule, alkyne quaternary ammonium with one quaternary ammonium group or two or more than 2 quaternary ammonium groups in the same molecule; and counter ions N⁻ for R⁺ group is selected from the group consisting of carbonate anion, sulfate anion or phosphate anion; and combinations thereof.

2. The composition of claim 1; wherein the amino acid and amino acid derivative is selected from the group consisting of glycine, D-alanine, L-alanine, DL-alanine, beta-alanine, valine, leucine, isolueciene, phenylamine, proline, serine, threonine, tyrosine, glutamine, asparanine, glutamic acid, aspartic acid, tryptophan, histidine, arginine, lysine, methionine, cysteine, iminodiacetic acid, and combinations thereof; and the organic amine has a general molecular structure selected from the group consisting of:

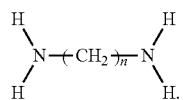

(a)

wherein n is from 2 to 12;

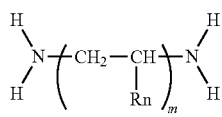

(b)

wherein, Rn represents an organic $C_1$ to $C_{12}$ alkyl group; m is from 2 to 12;

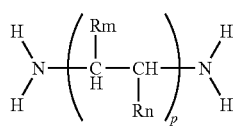

(c)

wherein Rn and Rm can be the same or different $C_1$ to $C_{12}$ alkyl groups; p is from 2 to 12;

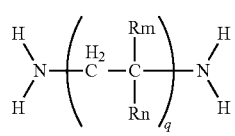

(d)

wherein Rn and Rm can be the same or different $C_1$ to $C_{12}$ alkyl groups; q is from 2 to 12;

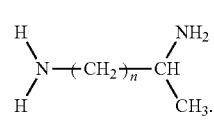

(e)

wherein n is from 1 to 12;

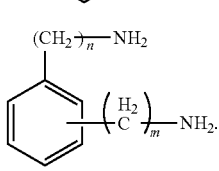

(f)

(g)

wherein n and m are each independently from 1 to 12; and combinations thereof.

3. The composition of claim 1, wherein the amino acid is selected from the group consisting of glycine, D-alanine, L-alanine, DL-alanine, beta-alanine, and combinations thereof; and the amine is selected from the group consisting of ethylenediamin, propylenediamine, butylenediamine, pentalene diamine, hexylene diamine, and combinations thereof.

4. The composition of claim 1, wherein the chemical additive selected from the group consisting of 3-Morpholino-1,2-propanediol (MOPDIO), morpholine when R is hydrogen atom, 2-methyl-2-morpholinopropanal, 4-(2-hydroxyethyl)morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine,2-(Aminomethyl)morpholine, morpholin-2-yl(pyridin-4-yl)methanol, 1-morpholin-4-ylmethylcyclohexylamine, 1-Morpholinohexane-1,3-dione, and combinations thereof.

5. The composition of claim 1, wherein the organic quaternary ammonium salt ranges from 0.001 wt. % to 0.05 wt. % and is a choline salt formed between choline and other anionic counter ions having the general molecular structures shown below:

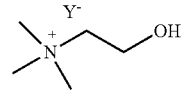

wherein anion Y⁻ can be bicarbonate, hydroxide, p-toluene-sulfonate, bitartate, and other suitable anionic counter ions; and the pH adjusting agent ranges from 0.01 wt. % to 0.5 wt. % and is selected from the group consisting of (1) nitric acid, hydrochloric acid, sulfuric acid, phosphoric acid, other inorganic or organic acids, and mixtures thereof for acidic pH conditions; or (2) sodium hydride, potassium hydroxide, ammonium hydroxide, tetraalkyl ammonium hydroxide, organic quaternary ammonium hydroxide compounds, organic amines, and combinations thereof for alkaline pH conditions.

6. The composition of claim 1, wherein the composition comprises
colloidal silica,
at least one amino acid selected from the group consisting of glycine, D-alanine, L-alanine, DL-alanine, beta-alanine, and combinations thereof;
at least one selected from the group consisting of 3-Morpholino-1,2-propanediol (MOPDIO), morpholine, 2-methyl-2-morpholinopropanal, 4-(2-hydroxyethyl) morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine,2-(Aminomethyl)morpholine, morpholin-2-yl(pyridin-4-yl)methanol, 1-morpholin-4-ylmethyl-cyclohexylamine, 1-Morpholinohexane-1,3-dione, and combinations thereof;
hydrogen peroxide;
water;
optionally
at least one amine selected from the group consisting of ethylenediamin, propylenediamine, butylenediamine, pentalene diamine, hexylene diamine, and combinations thereof; and
choline bicarbonate (CBC).

7. The composition of claim 6, wherein the composition has a pH from 6.0 to 7.5.

8. A method of chemical mechanical polishing at least one metal or metal-containing surface of a semiconductor substrate, using a chemical mechanical polishing or Through Silica Via (TSV) composition comprising steps of:
1) providing the semiconductor substrate;
2) providing a polish pad;
3) providing the chemical mechanical polishing or Through Silica Via (TSV) composition in claim 1;
4) polishing the at least one metal or metal-containing surface of the semiconductor substrate;
wherein at least a portion of the metal or metal-containing is in contact with both the polishing pad and the chemical mechanical polishing composition; and
the metal film is selected from the group consisting of Cu film, Co film, W film, Ni film, Al film, and combinations thereof.

9. The method of claim 8; wherein
the amino acid and amino acid derivative is selected from the group consisting of glycine, D-alanine, L-alanine, DL-alanine, beta-alanine, valine, leucine, isolueciene, phenylamine, proline, serine, threonine, tyrosine, glutamine, asparanine, glutamic acid, aspartic acid, tryptophan, histidine, arginine, lysine, methionine, cysteine, iminodiacetic acid, and combinations thereof; and
the organic amine has a general molecular structure selected from the group consisting of:

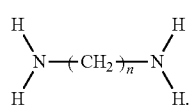

(a)

wherein n is from 2 to 12;

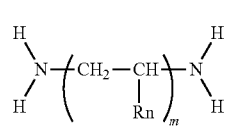

(b)

wherein, Rn represents an organic $C_1$ to $C_{12}$ alkyl group, m is from 2 to 12;

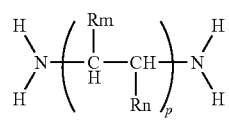

(c)

wherein Rn and Rm can be the same or different $C_1$ to $C_{12}$ alkyl groups, p is from 2 to 12;

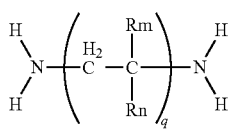

(d)

wherein Rn and Rm can be the same or different $C_1$ to $C_{12}$ alkyl groups, q is from 2 to 12;

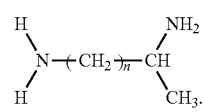

(e)

wherein n is from 1 to 12;

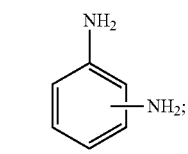

(f)

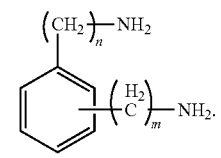

(g)

wherein n and m are each independent from 1 to 12;
and combinations thereof.

10. The method of claim 8; wherein the amino acid is selected from the group consisting of glycine, D-alanine, L-alanine, DL-alanine, beta-alanine, and combinations thereof; and the amine is selected from the group consisting of ethylenediamin, propylenediamine, butylenediamine, pentalene diamine, hexylene diamine, and combinations thereof.

11. The method of claim 8; wherein the chemical additive selected from the group consisting of 3-Morpholino-1,2- propanediol (MOPDIO), morpholine when R is hydrogen atom, 2-methyl-2-morpholinopropanal, 4-(2-hydroxyethyl)morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine, 2-(Aminomethyl)morpholine, morpholin-2-yl(pyridin-4-yl)methanol, 1-morpholin-4-ylmethyl-cyclohexylamine, 1-Morpholinohexane-1,3-dione, and combinations thereof.

12. The method of claim 8; wherein
the organic quaternary ammonium salt ranges from 0.001 wt. % to 0.05 wt. % and is a choline salt formed between choline and other anionic counter ions having the general molecular structures shown below:

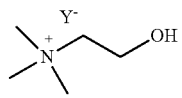

wherein anion Y⁻ can be bicarbonate, hydroxide, p-toluene-sulfonate, bitartate, and other suitable anionic counter ions; and the pH adjusting agent ranges from 0.01 wt. % to 0.5 wt. % and is selected from the group consisting of (1) nitric acid, hydrochloric acid, sulfuric acid, phosphoric acid, other inorganic or organic acids, and mixtures thereof for acidic pH conditions; or (2) sodium hydride, potassium hydroxide, ammonium hydroxide, tetraalkyl ammonium hydroxide, organic quaternary ammonium hydroxide compounds, organic amines, and combinations thereof for alkaline pH conditions.

13. The method of claim 8; wherein the composition comprises
colloidal silica,
at least one amino acid selected from the group consisting of glycine, D-alanine, L-alanine, DL-alanine, beta-alanine, and combinations thereof;
at least one selected from the group consisting of 3-Morpholino-1,2-propanediol (MOPDIO), morpholine when R is hydrogen atom, 2-methyl-2-morpholinopropanal, 4-(2-hydroxyethyl)morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine, 2-(Aminomethyl)morpholine, morpholin-2-yl(pyridin-4-yl)methanol, 1-morpholin-4-ylmethyl-cyclohexylamine, 1-Morpholinohexane-1,3-dione, and combinations thereof;
hydrogen peroxide;
water;
optionally
at least one amine selected from the group consisting of ethylenediamin, propylenediamine, butylenediamine, pentalene diamine, hexylene diamine, and combinations thereof; and
choline bicarbonate (CBC).

14. The method of claim 8, wherein the chemical mechanical polishing or Through Silica Via (TSV) composition has a pH from 6.0 to 7.5.

15. A system of chemical mechanical polishing at least one metal or metal-containing surface of a semiconductor substrate, comprising
1) the semiconductor substrate;
2) a polish pad;
3) a chemical mechanical polishing or Through Silica Via (TSV) composition in claim 1;

wherein at least a portion of the at least one metal or metal-containing surface is in contact with both the polishing pad and the chemical mechanical polishing or Through Silica Via (TSV) composition; and the metal is selected from the group consisting of Cu, Co, W, Ni, Al, and combinations thereof.

16. The system of claim 15; wherein
the amino acid and amino acid derivative is selected from the group consisting of glycine, D-alanine, L-alanine, DL-alanine, beta-alanine, valine, leucine, isolueciene, phenylamine, proline, serine, threonine, tyrosine, glutamine, asparanine, glutamic acid, aspartic acid, tryptophan, histidine, arginine, lysine, methionine, cysteine, iminodiacetic acid, and combinations thereof; and
the organic amine has a general molecular structure selected from the group consisting of:

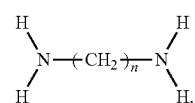

(a)

wherein n is from 2 to 12;

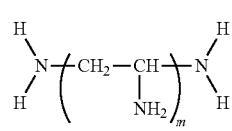

(b)

wherein, Rn represents an organic $C_1$ to $C_{12}$ alkyl group having, m is from 2 to 12;

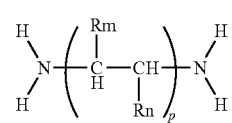

(c)

wherein Rn and Rm can be the same or different $C_1$ to $C_{12}$ alkyl groups, p is from 2 to 12;

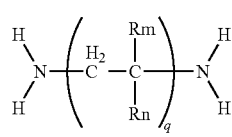

(d)

wherein Rn and Rm can be the same or different $C_1$ to $C_{12}$ alkyl groups, q is from 2 to 12;

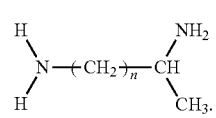

(e)

wherein n is from 1 to 12;

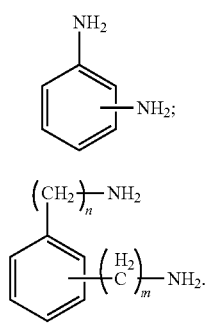

wherein n and m are each independent from 1 to 12; and combinations thereof.

17. The system of claim 15, wherein the amino acid is selected from the group consisting of glycine, D-alanine, L-alanine, DL-alanine, beta-alanine, and combinations thereof; and the amine is selected from the group consisting of ethylenediamin, propylenediamine, butylenediamine, pentalene diamine, hexylene diamine, and combinations thereof.

18. The system of claim 15, wherein the chemical additive selected from the group consisting of 3-Morpholino-1,2-propanediol (MOPDIO), morpholine when R is hydrogen atom, 2-methyl-2-morpholinopropanal, 4-(2-hydroxyethyl)morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine, 2-(Aminomethyl)morpholine, morpholin-2-yl(pyridin-4-yl)methanol, 1-morpholin-4-ylmethyl-cyclohexylamine, 1-Morpholinohexane-1,3-dione, and combinations thereof.

19. The system of claim 15, wherein
the organic quaternary ammonium salt ranges from 0.001 wt. % to 0.05 wt. % and is a choline salt formed between choline and other anionic counter ions having the general molecular structures shown below:

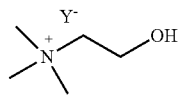

wherein anion $Y^-$ can be bicarbonate, hydroxide, p-toluene-sulfonate, bitartate, and other suitable anionic counter ions; and the pH adjusting agent ranges from 0.01 wt. % to 0.5 wt. % and is selected from the group consisting of (1) nitric acid, hydrochloric acid, sulfuric acid, phosphoric acid, other inorganic or organic acids, and mixtures thereof for acidic pH conditions; or (2) sodium hydride, potassium hydroxide, ammonium hydroxide, tetraalkyl ammonium hydroxide, organic quaternary ammonium hydroxide compounds, organic amines, and combinations thereof for alkaline pH conditions.

20. The system of claim 15, wherein the composition comprises colloidal silica, at least one amino acid selected from the group consisting of glycine, D-alanine, L-alanine, DL-alanine, beta-alanine, and combinations thereof;

at least one selected from the group consisting of 3-Morpholino-1,2-propanediol (MOPDIO), morpholine when R is hydrogen atom, 2-methyl-2-morpholinopropanal, 4-(2-hydroxyethyl)morpholine, 4-(3-hydroxypropyl)morpholine, (2-morpholinophenyl)methanol, 2-(2-hydroxyethyl)morpholine, 2-(4-Morpholinyl)-2-oxoethanol, 4-(2-Aminoethyl)morpholine, 2-(Aminomethyl)morpholine, morpholin-2-yl(pyridin-4-yl)methanol, 1-morpholin-4-ylmethyl-cyclohexylamine, 1-Morpholinohexane-1,3-dione, and combinations thereof;

hydrogen peroxide;

water;

optionally at least one amine selected from the group consisting of ethylenediamin, propylenediamine, butylenediamine, pentalene diamine, hexylene diamine, and combinations thereof; and choline bicarbonate (CBC).

21. The system of claim 15, wherein the chemical mechanical polishing or Through Silica Via (TSV) composition has a pH from 6.0 to 7.5.

* * * * *